US010068868B2

(12) United States Patent
Shao et al.

(10) Patent No.: US 10,068,868 B2
(45) Date of Patent: Sep. 4, 2018

(54) MULTI-STRIKE PROCESS FOR BONDING PACKAGES AND THE PACKAGES THEREOF

(71) Applicant: Taiwan Semiconductor Manufacturing Company, Ltd., Hsin-Chu (TW)

(72) Inventors: Tung-Liang Shao, Hsin-Chu (TW); Chih-Hang Tung, Hsin-Chu (TW); Wen-Lin Shih, Taipei (TW); Hsiao-Yun Chen, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/433,421

(22) Filed: Feb. 15, 2017

(65) Prior Publication Data
US 2017/0194278 A1    Jul. 6, 2017

Related U.S. Application Data

(62) Division of application No. 14/997,727, filed on Jan. 18, 2016, now Pat. No. 9,576,929.

(Continued)

(51) Int. Cl.
*H01L 23/00*         (2006.01)
*H01L 25/00*         (2006.01)
(Continued)

(52) U.S. Cl.
CPC ............ *H01L 24/16* (2013.01); *B23K 1/0016* (2013.01); *B23K 1/06* (2013.01); *H01L 21/563* (2013.01); *H01L 23/3185* (2013.01); *H01L 24/05* (2013.01); *H01L 24/08* (2013.01); *H01L 24/13* (2013.01); *H01L 24/81* (2013.01); *H01L 25/0657* (2013.01); *H01L 25/50* (2013.01);
(Continued)

(58) Field of Classification Search
CPC ......... H01L 24/16; H01L 24/13; H01L 24/05; H01L 23/3185; H01L 25/0657; H01L 24/81; H01L 21/563; H01L 25/50; H01L 21/56; H01L 23/31; H01L 25/065; H01L 23/00; H01L 25/00
USPC ................ 257/737, 738, 778, 685, 686, 723
See application file for complete search history.

(56) References Cited

U.S. PATENT DOCUMENTS 5,116,783 A   5/1992 Tsumura
6,492,600 B1  12/2002 Jimarez et al.
(Continued)

FOREIGN PATENT DOCUMENTS

CN    102054811 A   5/2011
DE    3938152 C2    5/1994
(Continued)

*Primary Examiner* — Alexander Oscar Williams
(74) *Attorney, Agent, or Firm* — Slater Matsil, LLP

(57) ABSTRACT

A method includes performing a first strike process to strike a metal bump of a first package component against a metal pad of a second package component. A first one of the metal bump and the metal pad includes copper. A second one of the metal bump and the metal pad includes aluminum. The method further includes performing a second strike process to strike the metal bump against the metal pad. An annealing is performed to bond the metal bump on the metal pad.

20 Claims, 18 Drawing Sheets

Related U.S. Application Data

(60) Provisional application No. 62/272,840, filed on Dec. 30, 2015.

(51) Int. Cl.
   *H01L 21/56* (2006.01)
   *H01L 23/31* (2006.01)
   *H01L 25/065* (2006.01)
   *B23K 1/00* (2006.01)
   *B23K 1/06* (2006.01)

(52) U.S. Cl.
   CPC .......... *H01L 2224/0401* (2013.01); *H01L 2224/05124* (2013.01); *H01L 2224/08059* (2013.01); *H01L 2224/08503* (2013.01); *H01L 2224/13147* (2013.01); *H01L 2224/1607* (2013.01); *H01L 2224/16145* (2013.01); *H01L 2224/16503* (2013.01); *H01L 2224/81012* (2013.01); *H01L 2224/81022* (2013.01); *H01L 2224/8181* (2013.01); *H01L 2224/81365* (2013.01); *H01L 2224/81379* (2013.01); *H01L 2224/81948* (2013.01); *H01L 2225/06513* (2013.01); *H01L 2924/01013* (2013.01); *H01L 2924/01029* (2013.01)

(56) References Cited

U.S. PATENT DOCUMENTS

| | | | |
|---|---|---|---|
| 7,838,424 B2 | 11/2010 | Karta et al. | |
| 7,863,742 B2 | 1/2011 | Yu et al. | |
| 7,932,601 B2 | 4/2011 | Chang et al. | |
| 8,754,508 B2 | 6/2014 | Chen et al. | |
| 8,772,151 B2 | 7/2014 | Chen | |
| 8,846,548 B2 | 9/2014 | Tu et al. | |
| 9,576,929 B1* | 2/2017 | Shao | H01L 25/50 |
| 9,607,936 B2 | 3/2017 | Hsiao et al. | |
| 2004/0101993 A1* | 5/2004 | Salmon | H01L 23/49811 438/107 |
| 2006/0035453 A1 | 2/2006 | Kim et al. | |
| 2008/0274028 A1 | 11/2008 | Lin et al. | |
| 2009/0162622 A1* | 6/2009 | Van Veen | B23K 35/0222 428/198 |
| 2012/0001336 A1* | 1/2012 | Zeng | H01L 24/05 257/769 |
| 2012/0223432 A1* | 9/2012 | Delucca | H01L 24/05 257/771 |
| 2013/0143653 A1 | 6/2013 | Yamaoka | |
| 2013/0277825 A1* | 10/2013 | Zhang | H01L 23/293 257/734 |
| 2013/0341800 A1 | 12/2013 | Tu et al. | |
| 2014/0015122 A1 | 1/2014 | Chou et al. | |
| 2014/0027170 A1 | 1/2014 | Shimadu et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0077358 A1* | 3/2014 | Chen | H01L 21/76885 257/737 |
| 2014/0183693 A1 | 7/2014 | Tsai et al. | |
| 2014/0187103 A1 | 7/2014 | Chen et al. | |
| 2014/0191393 A1 | 7/2014 | Hung et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0262468 A1 | 9/2014 | Chen et al. | |
| 2014/0264885 A1 | 9/2014 | Tsai et al. | |

FOREIGN PATENT DOCUMENTS

| | | |
|---|---|---|
| EP | 1740026 A2 | 1/2007 |
| KR | 200607058 A | 2/2006 |

\* cited by examiner

MULTI-STRIKE PROCESS FOR BONDING PACKAGES AND THE PACKAGES THEREOF

PRIORITY CLAIM AND CROSS-REFERENCE

This application is a divisional of U.S. patent application Ser. No. 14/997,727, filed Jan. 18, 2016, and entitled "Multi-Strike Process for Bonding", now U.S. Pat. No. 9,575,929 B1, which application claims the benefit of the following provisionally filed U.S. Patent application: Application Ser. No. 62/272,840, filed Dec. 30, 2015, and entitled "Multi-Strike Process for Bonding;" which applications are hereby incorporated herein by reference.

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

Three-dimensional (3D) integrated circuits (ICs) were therefore explored to resolve the above-discussed limitations. In a typical formation process of 3DIC, two wafers or dies, each including some integrated circuits, are formed, and are then bonded together. The bonding typically includes using solder to bond the nickel layers that are formed on copper bumps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
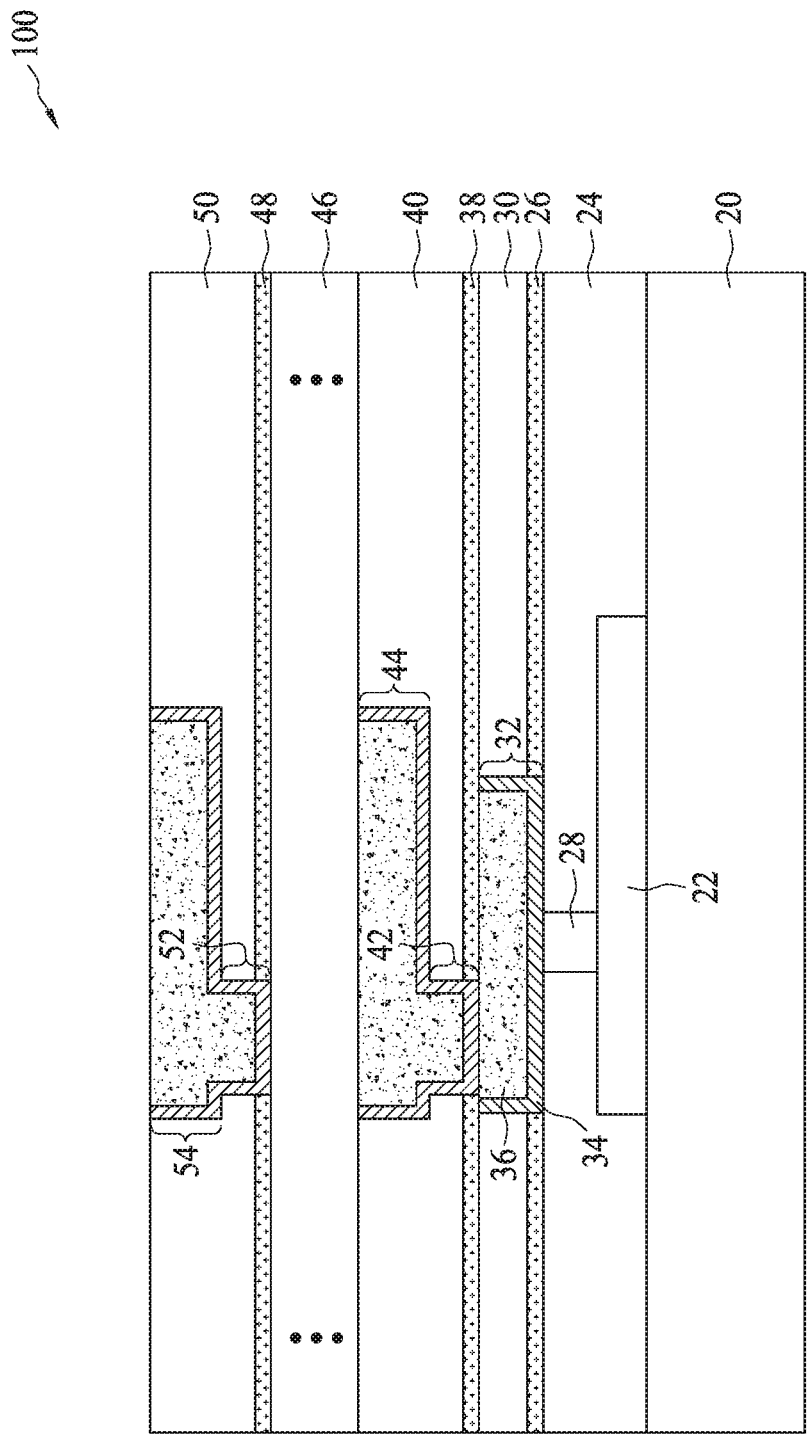
FIGS. 1 through 14 illustrate the cross-sectional views of intermediate stages in the formation of dies/wafers and the bonding process for forming a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the bond structure are illustrated. Some variations of some embodiments are discussed. Throughout the various views and illustrative embodiments, like reference numbers are used to designate like elements.

Figure 18:
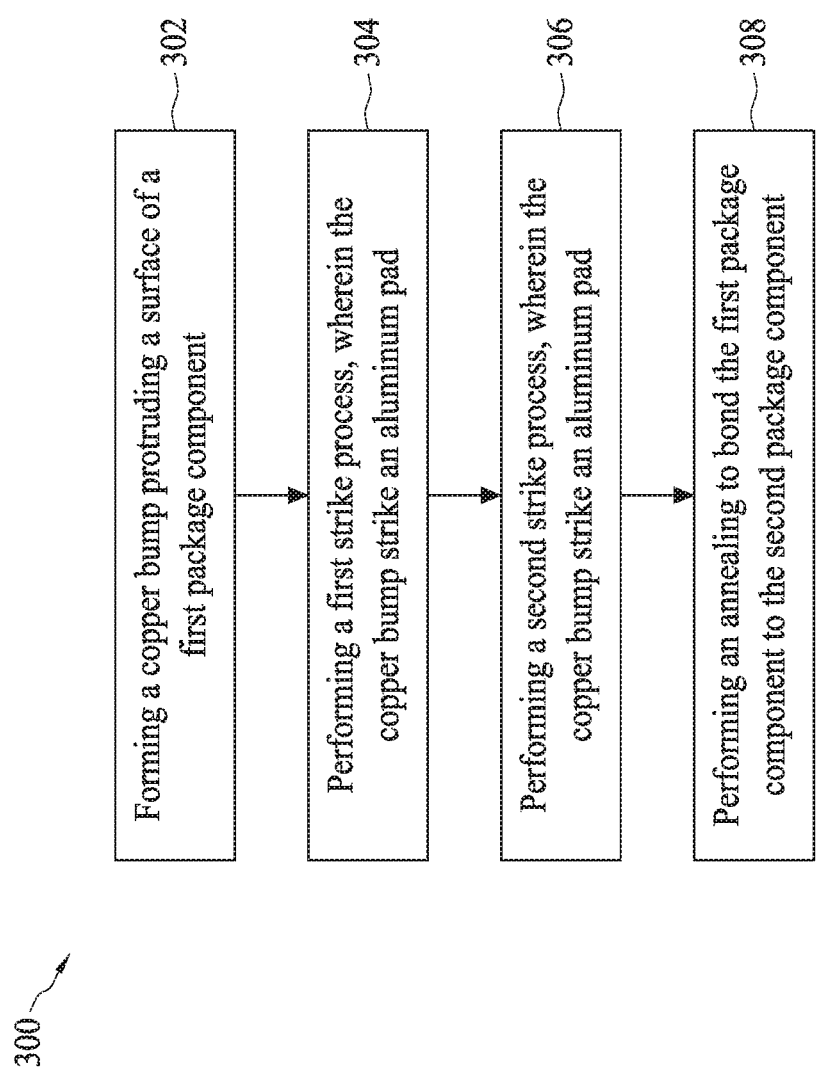
FIG. 18 illustrates a process flow for forming a package through bonding in accordance with some embodiments.

FIGS. 1 through 14 illustrate the cross-sectional views of intermediate stages in the formation of a package in accordance with some embodiments. The steps shown in FIGS. 1 through 14 are also illustrated schematically in the process flow shown in FIG. 18.

FIG. 1 illustrates a cross-sectional view of package component 100. In accordance with some embodiments of the present disclosure, package component 100 is a device wafer including active devices such as transistors and/or diodes, and possibly passive devices such as capacitors, inductors, resistors, or the like. In accordance with alternative embodiments of the present disclosure, package component 100 is an interposer wafer, which may or may not include active devices and/or passive devices. In accordance with yet alternative embodiments of the present disclosure, package component 100 is a package substrate strip, which may be package substrates with cores therein or core-less package substrates. In subsequent discussion, a device wafer is used as an exemplary package component 100. The concept of the present disclosure may also be applied to interposer wafers, package substrates, etc.

In accordance with some embodiments of the present disclosure, the exemplary wafer 100 includes semiconductor substrate 20 and the features formed at a top surface of semiconductor substrate 20. Semiconductor substrate 20 may be formed of crystalline silicon, crystalline germanium, silicon germanium, and/or a III-V compound semiconductor such as GaAsP, AlInAs, AlGaAs, GaInAs, GaInP, GaInAsP, and the like. Semiconductor substrate 20 may also be a bulk silicon substrate or a Silicon-On-Insulator (SOI) substrate.

Shallow Trench Isolation (STI) regions (not shown) may be formed in semiconductor substrate 12 to isolate the active regions in semiconductor substrate 20. Although not shown, through-vias may also be formed to extend into semiconductor substrate 20, wherein the through-vias are used to electrically inter-couple the conductive features on opposite sides of wafer 100.

In accordance with some embodiments of the present disclosure, wafer 100 includes integrated circuit devices 22, which are formed on the top surface of semiconductor substrate 20. Exemplary integrated circuit devices 22 include Complementary Metal-Oxide Semiconductor (CMOS) transistors, resistors, capacitors, diodes, and the like. The details of integrated circuit devices 22 are not illustrated herein. In accordance with alternative embodiments, wafer 100 is used for forming interposers, with active devices not formed, wherein substrate 20 may be a semiconductor substrate or a dielectric substrate.

Inter-Layer Dielectric (ILD) 24 is formed over semiconductor substrate 20 and fills the space between the gate stacks of transistors (not shown) in integrated circuit devices 22. In accordance with some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In accordance with alternative embodiments of the present disclosure, ILD 24 is formed using a deposition method such as Plasma Enhanced Chemical Vapor Deposition (PECVD), Low Pressure Chemical Vapor Deposition (LPCVD), or the like.

Contact plug 28 is formed in ILD 24, and is used to electrically connect integrated circuit devices 22 to overlying metal lines and vias. In accordance with some embodiments of the present disclosure, contact plug 28 is formed of a conductive material selected from tungsten, aluminum, copper, titanium, tantalum, titanium nitride, tantalum nitride, alloys therefore, and/or multi-layers thereof. The formation of contact plug 28 may include forming an opening in ILD 24, filling a conductive material(s) into the contact opening, and performing a planarization (such as Chemical Mechanical Polish (CMP)) to level the top surface of contact plug 28 with the top surface of ILD 24.

As also shown in FIG. 1, etch stop layer 26 is formed over ILD 24 and integrated circuit devices 22, if any. Etch stop layer 26 may be formed of silicon carbide, silicon nitride, silicon oxynitride, silicon carbo-nitride, or the like. Etch stop layer 26 is also formed of a material that has a high etching selectivity relative to the overlying dielectric layer 30, and hence etch stop layer 26 may be used to stop the etching of dielectric layer 30.

Further illustrated in FIG. 1 is dielectric layer 30, which is alternatively referred to as Inter-Metal Dielectric (IMD) layer 30 hereinafter. In accordance with some embodiments of the present disclosure, IMD layer 30 is formed of a low-k dielectric material having a dielectric constant (k-value) lower than about 3.0, about 2.5, or even lower. IMD layer 30 may be formed of Black Diamond (a registered trademark of Applied Materials), a carbon-containing low-k dielectric material, Hydrogen SilsesQuioxane (HSQ), MethylSilsesQuioxane (MSQ), or the like. IMD layer 30 may also have a low-k value, which may be lower than about 3.0, 2.5, or 2.0. In accordance with some embodiments of the present disclosure, the formation of IMD layer 30 includes depositing a porogen-containing dielectric material and then performing a curing process to drive out the porogen, and hence the remaining IMD layer 30 is porous. In accordance with alternative embodiments, IMD layer 30 is formed of a non-low-k dielectric material such as silicon oxide, silicon nitride, silicon carbide, silicon oxynitride, or the like.

Conductive line 32 is formed in IMD layer 30. In accordance with some embodiments, metal line 32 includes diffusion barrier layers 34 and copper-containing material 36 over diffusion barrier layer 34. Diffusion barrier layer 34 may include titanium, titanium nitride, tantalum, tantalum nitride, or the like, and have the function of preventing copper in copper-containing material 36 from diffusing into IMD layer 30. Conductive line 32 is also referred to as metal line 32 hereinafter. The formation of conductive line 32 may include a single damascene process.

Etch stop layer 38 and IMD layer 40 are formed over IMD 30 and conductive line 32. In accordance with some embodiments of the present application, etch stop layer 38 is formed of a dielectric material selected from silicon carbide, silicon nitride, silicon oxynitride, silicon carbo-nitride, or the like. IMD layer 40 may be formed of a low-k dielectric material or a non-low-k dielectric material, and the material of IMD layer 40 may be selected from the same group of candidate materials for forming IMD 30.

Conductive via 42 and conductive line 44 are formed to electrically couple to conductive line 32. In accordance with some embodiments of the present disclosure, the formation of via 42 and conductive line 44 includes forming a via opening and a trench, performing a blanket deposition to form conductive liner, depositing a thin seed layer (not shown) of copper or copper alloy, and filling the rest of via opening and trench by, for example, electro-plating, electro-less plating, deposition, or the like with a conductive material. The conductive liner may be formed of titanium, titanium nitride, tantalum, tantalum nitride, or other alternatives. The conductive material may include copper, a copper alloy, silver, gold, tungsten, aluminum, or the like. A planarization such as CMP is performed to level the surface of the conductive liner and the conductive material, and to remove excess materials from the top surface of IMD layer 40.

FIG. 1 also schematically illustrates the formation of more dielectric (IMD) layers 46 and the respective conductive lines and vias (not shown) in dielectric layers 46. The number of IMD layers 46 is determined based on the routing requirement of the package component 100, and may range from 0 to 7 or more in accordance with some exemplary embodiments. The number of IMD layers 46 equaling to 0 means the subsequently formed etch stop layer 48 and dielectric layer 56 are formed directly over IMD layer 40 with no additional dielectric layer and conductive lines therebetween. The conductive lines and vias (not shown) in IMD layers 46 are electrically coupled to integrated circuit devices 22.

Etch stop layer 48 and IMD layer 50 are formed over dielectric layers 46. In accordance with some embodiments of the present application, etch stop layer 48 is formed of a dielectric material selected from the same group of candidate materials for forming etch stop layer 26, wherein the candidate materials may include silicon carbide, silicon nitride, silicon oxynitride, silicon carbo-nitride, or the like. IMD layer 50 may also be formed of a low-k dielectric material or a non-low-k dielectric material, and the material of IMD layer 50 may be selected from the same group of candidate materials for forming IMDs 30 and 40.

Referring to FIG. 1, via 52 and conductive feature 54 are formed in IMD layer 50. The materials of via 52 and conductive feature 54 may be selected from same candidate materials for forming via 42 and conductive line 44. The formation process is also similar to the formation of via 42 and conductive line 44, and hence is not repeated herein. Conductive feature 54 includes a conductive pad and possibly a conductive line.

Figure 2:
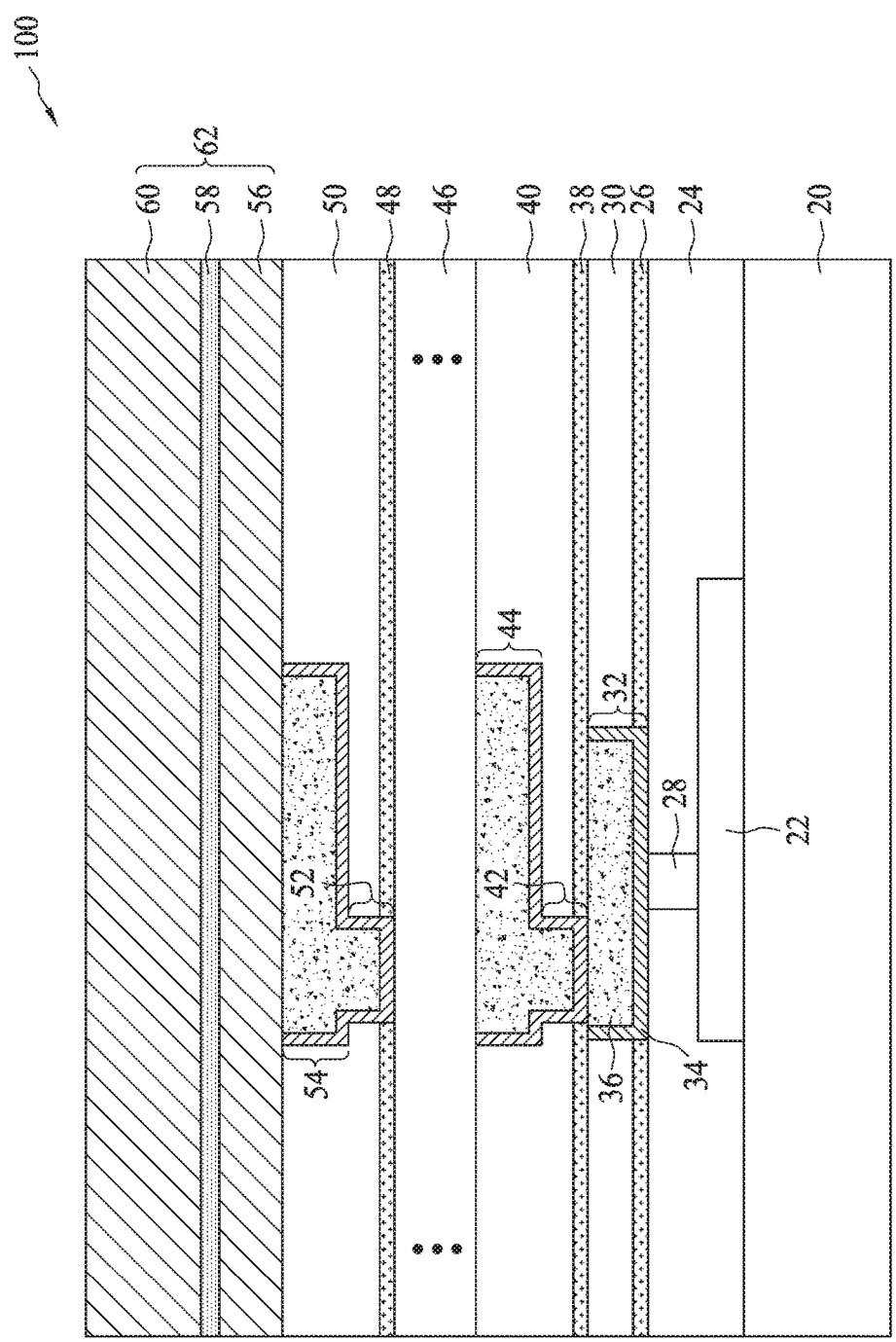

Referring to FIG. 2, dielectric layer 62 is formed over IMD layer 50. In accordance with some embodiments of the present disclosure, dielectric layer 62 is formed of a non-low-k dielectric material(s). For example, as shown in FIG. 2, dielectric layer 62 includes layer 56 over IMD layer 50, etch stop layer 58 over layer 56, and layer 60 over etch stop layer 58. In accordance with some exemplary embodiments of the present disclosure, dielectric layers 56 and 60 are formed of Undoped Silicate Glass (USG), and etch stop layer 58 is formed of a material (such as silicon nitride), different from the materials of dielectric layers 56 and 60. In accordance with alternative embodiments, an entirety of dielectric layer 62 is formed of a homogeneous dielectric material such as USG.

Figure 3:
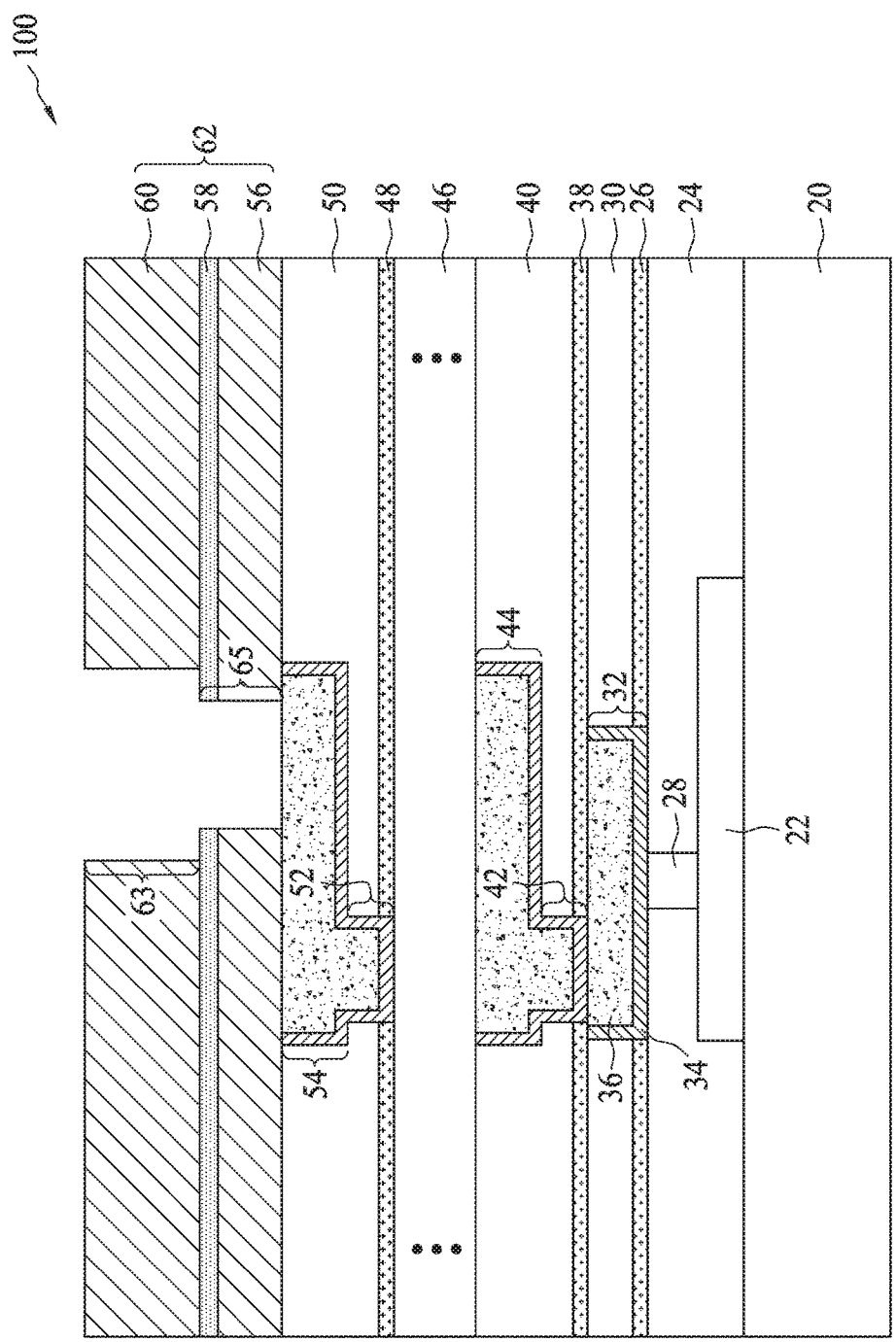

Referring to FIG. 3, trench 63 and via opening 65 are formed, and a pad portion of metal feature 54 is exposed. In accordance with some embodiments, the lateral dimension of via opening 65 is smaller than the lateral dimension of trench 63, as shown in FIG. 3. In accordance with alternative embodiments, the lateral dimension of via opening 65 is essentially the same as the lateral dimension of trench 63. Hence, trench 63 and via opening 65 in combination form an opening having a straight edge extending all the way from the top surface to the bottom surface of dielectric layer 62. When dielectric layer 62 is formed of a same material, a single etching process is used to form the opening.

Figure 4:
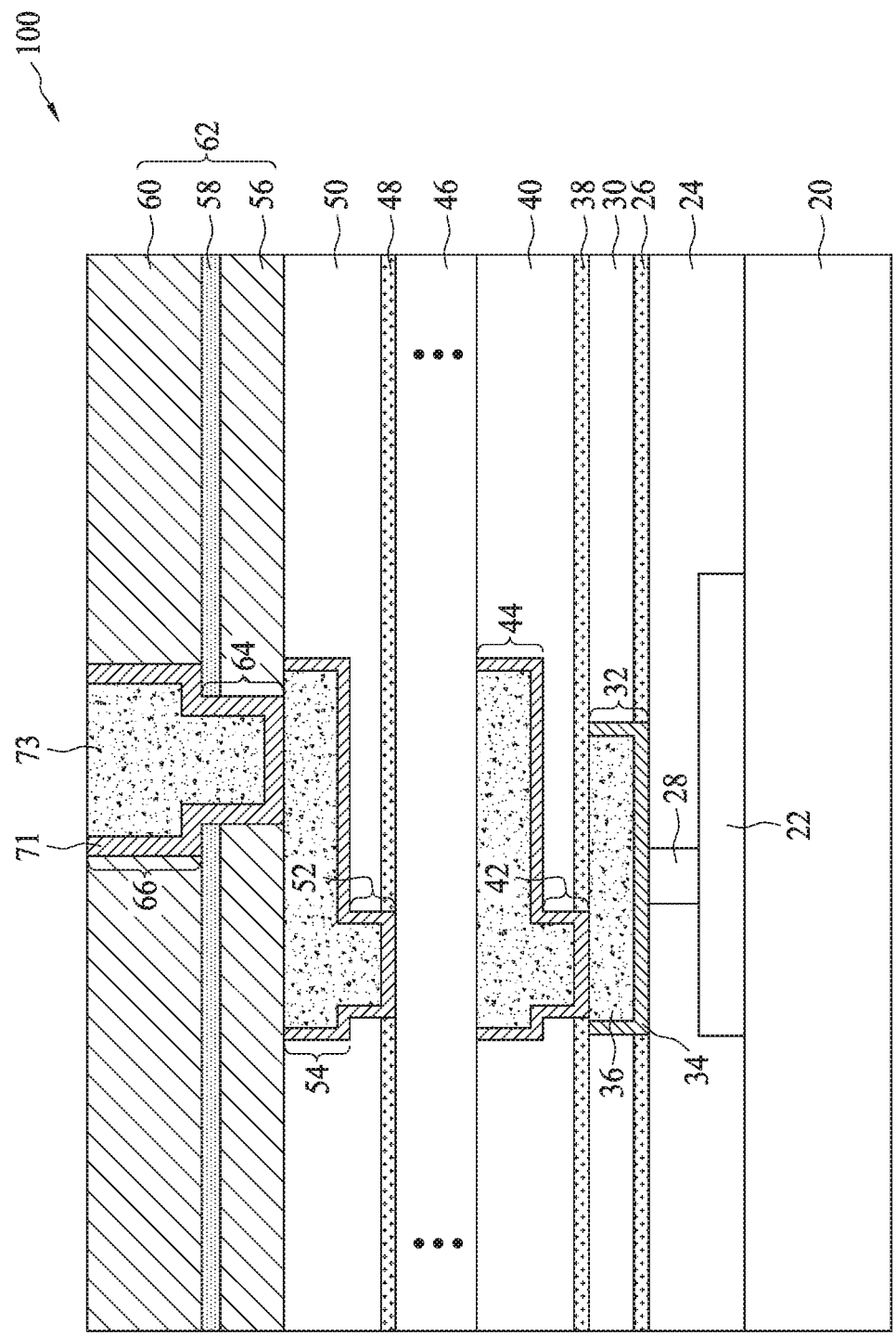

FIG. 4 illustrates the formation of via 64 and metal bump 66. In accordance with some embodiments, as shown in FIG. 4, via 64 and metal bump 66 include diffusion barrier layer 71 and copper-containing material 73. In accordance with alternative embodiments (refer to FIG. 6), via 64 and metal bump 66 includes the copper-containing material, with no diffusion barrier layer being formed. Copper-containing material 73 as shown in FIG. 4 may have a copper percentage higher than about 70 atomic percent or 90 percent. Copper-containing material 73 may also be formed of substantially pure copper (for example, with the copper atomic percentage being higher than about 99 percent).

Figure 5:
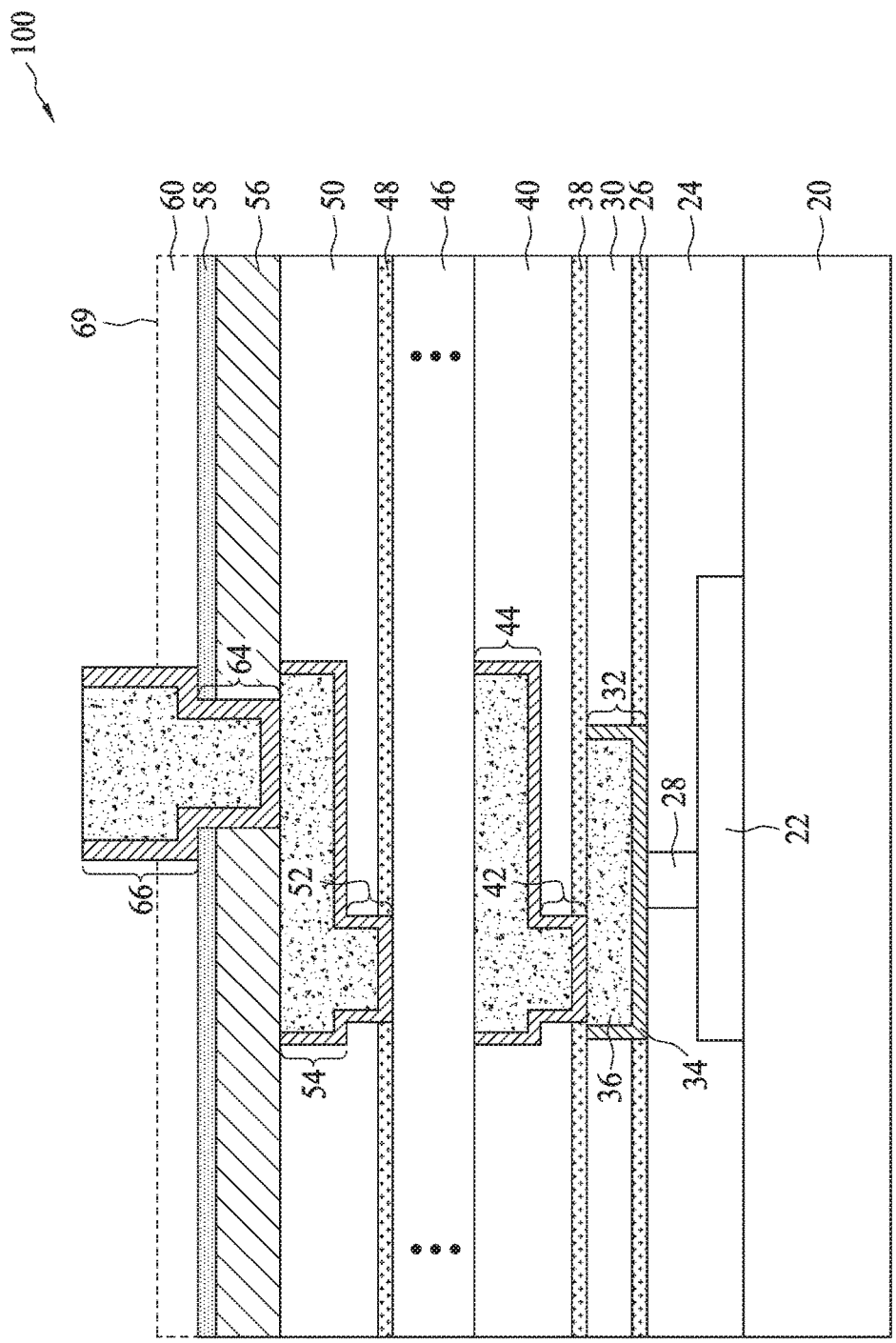
Figure 6:
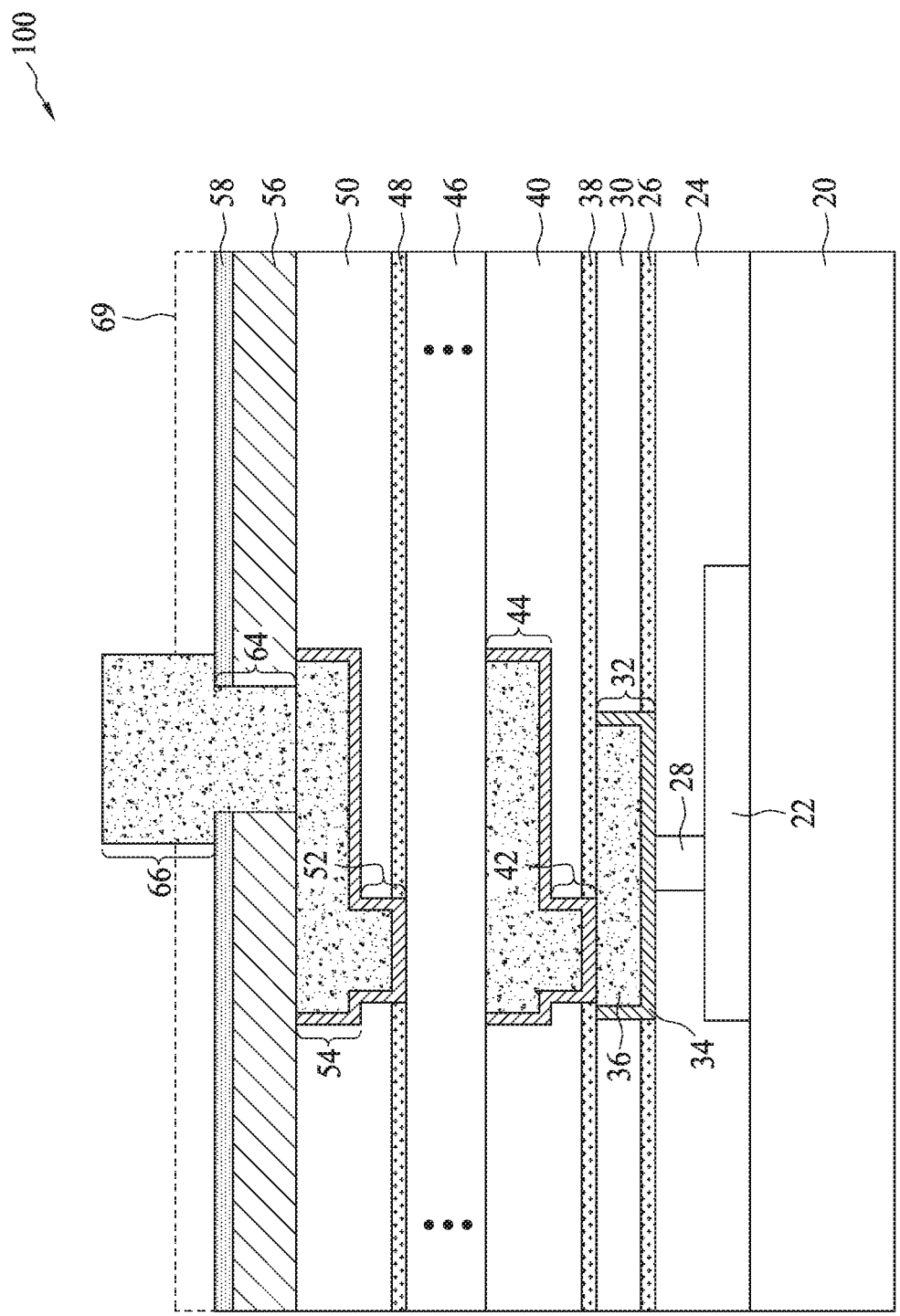

After the formation of metal bump 66, an etch back is performed to allow at least a portion of metal bump 66 to protrude out of the top surface of the remaining dielectric layer 62. For example, as shown in FIG. 5, dielectric layer 60 is etched, wherein etch stop layer 58 stops the etching, and is exposed after the etch back. In accordance with alternative embodiments, the etching is stopped before a bottom portion of dielectric layer 60 is etched. For example, a time mode may be used to stop the etching. Accordingly, dashed line 69 is used to illustrate the top surface of the resulting dielectric layer 60. FIG. 6 illustrates the structure wherein no diffusion barrier is formed in metal bump 66. The process steps shown in FIGS. 1 through 6 are illustrated as step 302 in the process flow shown in FIG. 18.

Figure 7:
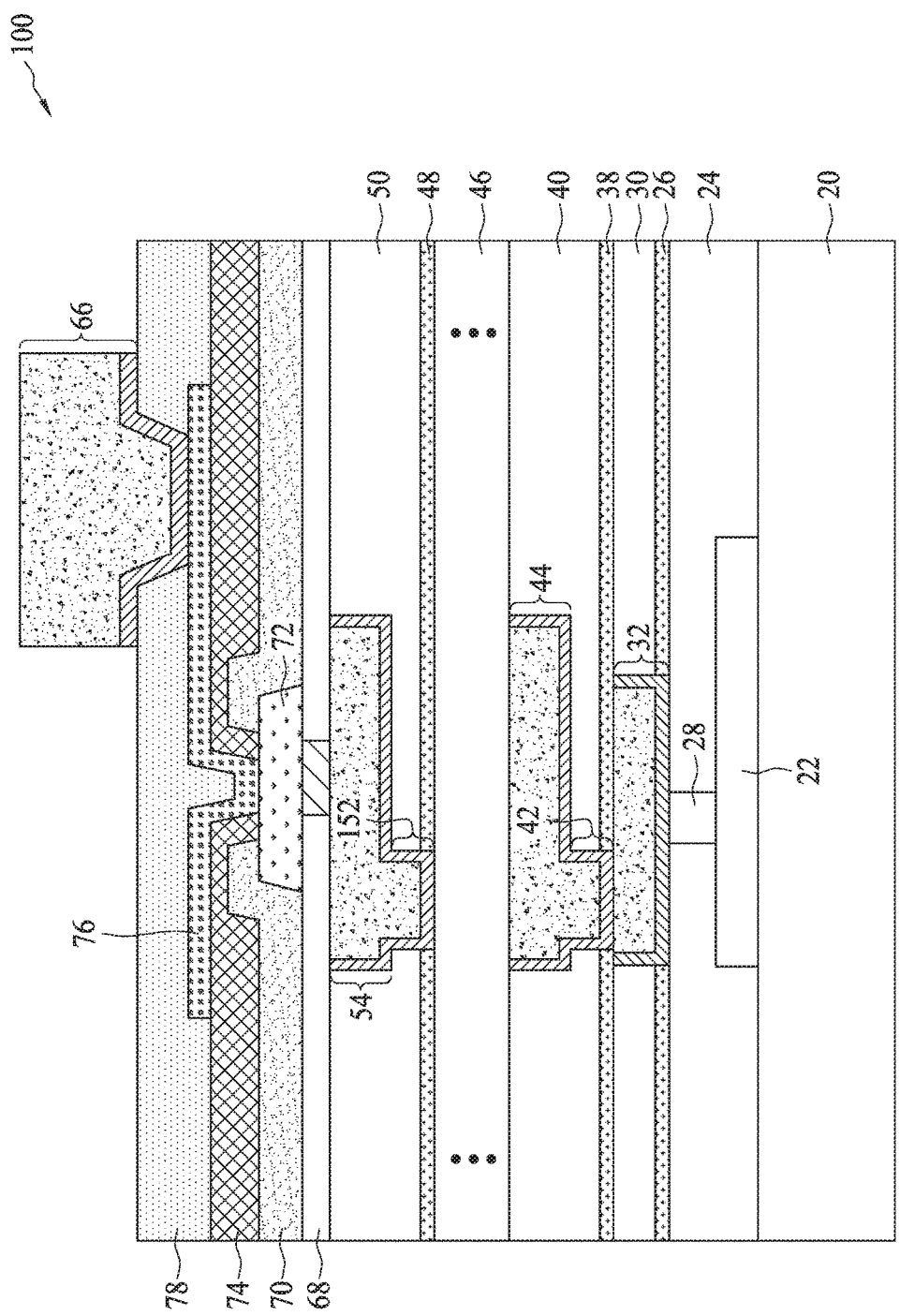

FIG. 7 illustrates a cross-sectional view of package component 100 in accordance with alternative embodiments. In these embodiments, passivation layer 68 is formed over the top low-k dielectric layer. Metal pad 72 is formed over passivation layer 68, and is electrically coupled to integrated circuit devices 22 through metal lines and vias. Metal pad 72 may be an aluminum pad or an aluminum-copper pad, and other metallic materials may be used.

Passivation layer 70 is formed to cover the edge portion of metal pad 72, and a central portion of metal pad 72 is exposed through an opening in passivation layer 70. Each of passivation layers 68 and 70 may be a single layer or a composite layer, and may be formed of non-low-k dielectric materials. In accordance with some embodiments of the present disclosure, one or both of passivation layers 68 and 70 is a composite layer comprising a silicon oxide layer (not shown), and a silicon nitride layer (not shown) over the silicon oxide layer.

Polymer layer 74 is formed over passivation layer 70. Polymer layer 74 may be formed of a polymer such as polyimide, PolyBenzOxazole (PBO), BenzoCycloButene (BCB), or the like. Polymer layer 74 is patterned, and Post-Passivation Interconnect (PPI) 76 is formed, which includes a first portion overlying polymer layer 74, and a second portion extending into polymer layer 74 to electrically couple to metal pad 72. Polymer layer 78 is formed over polymer layer 74. Polymer layer 78 may comprise polyimide or other polymer-based materials such as PBO or BCB. Metal bump 66 extends into polymer layer 78 to contact PPI 76. Metal bump 66 may include an Under-Bump-Metallurgy (UBM) and a copper-containing material over the UBM, as illustrated.

Figure 8:
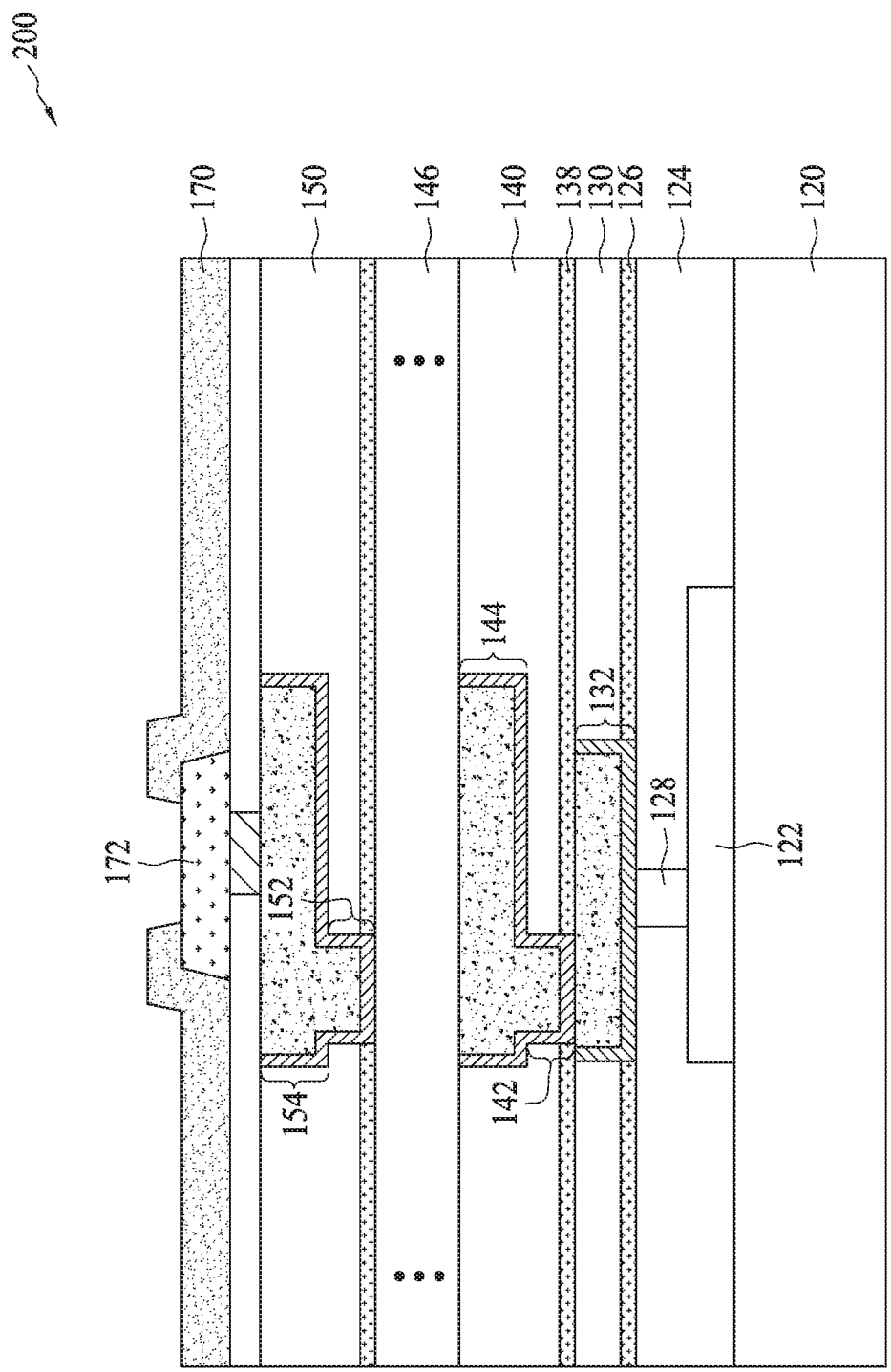

FIG. 8 illustrates the cross-sectional view of package component 200 in accordance with some embodiments. Package component 200 may be a device die including semiconductor substrate 120, active devices 122, ILD 124, contact plug 128, metal lines 132, 144, and 154, and vias 142 and 152. Furthermore, device die 200 may include low-k dielectric layers 130, 140, 146, and 150. Metal pad 172 and passivation layers 168 and 170 are also formed. Some portions of passivation layer 170 may cover the edge portion of metal pad 172. In accordance with some embodiments, metal pad 172 is an aluminum pad having an aluminum percentage higher than about 70 atomic percent, higher than about 90 percent, or may be formed of substantially pure aluminum (for example, with the aluminum atomic percentage being higher than about 99 percent).

FIGS. 9 through 14 illustrate the cross-sectional views of intermediate stages in the bonding of package components 100 and 200 in accordance with some embodiments, wherein a multiple-strike process is performed in the bonding. Package components 100 and 200 in FIGS. 9 through 13 are simplified, and the detailed structures of package components 100 and 200 may be found referring to FIGS. 1 through 8.

Figure 9:
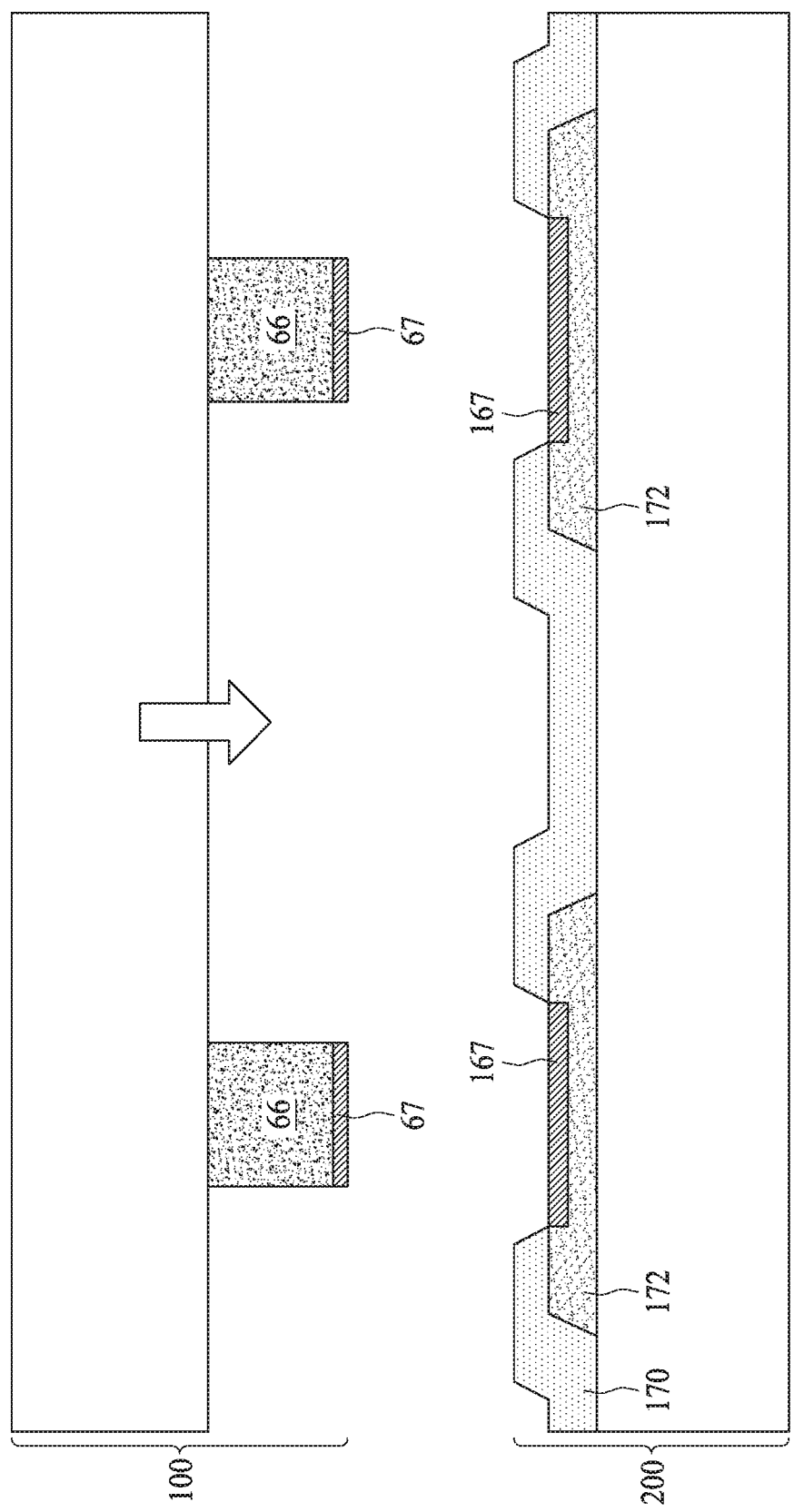
Figure 12:
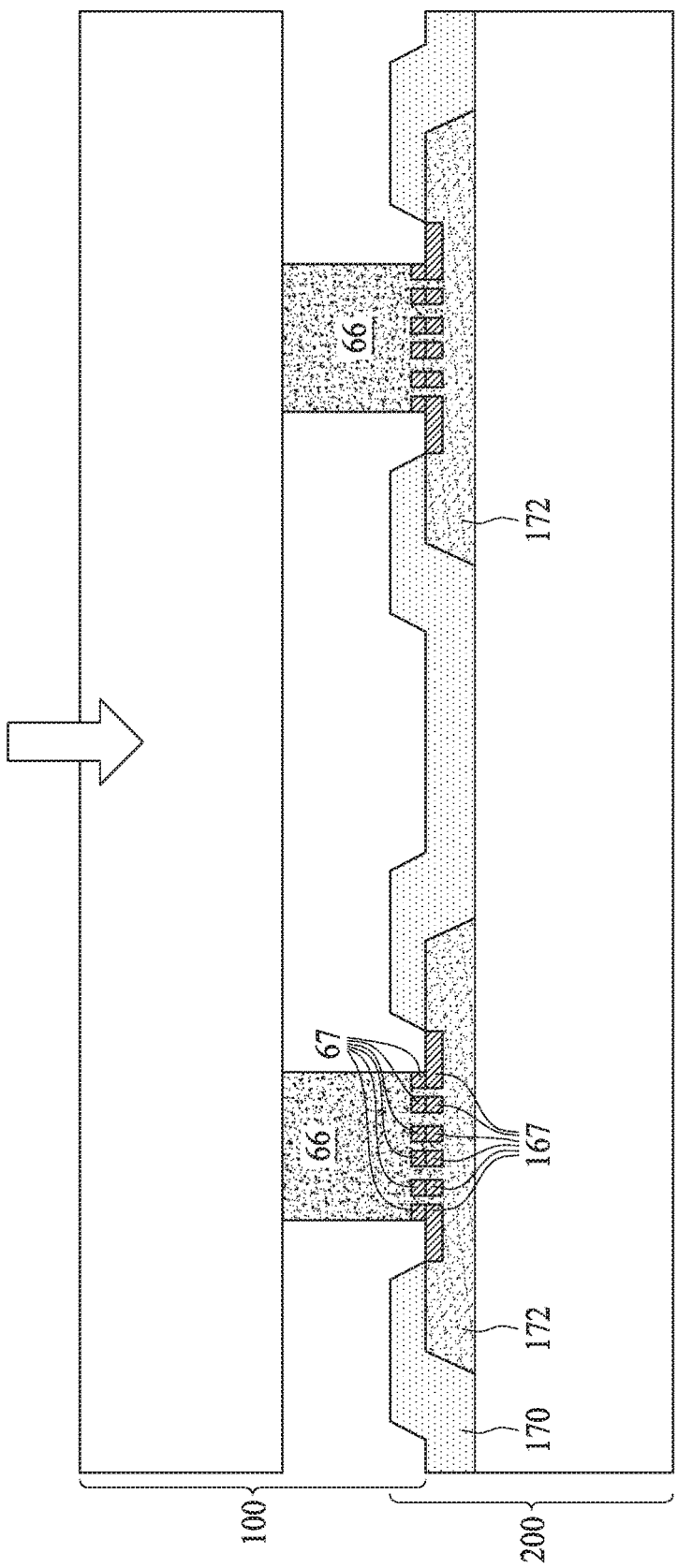
Figure 13:
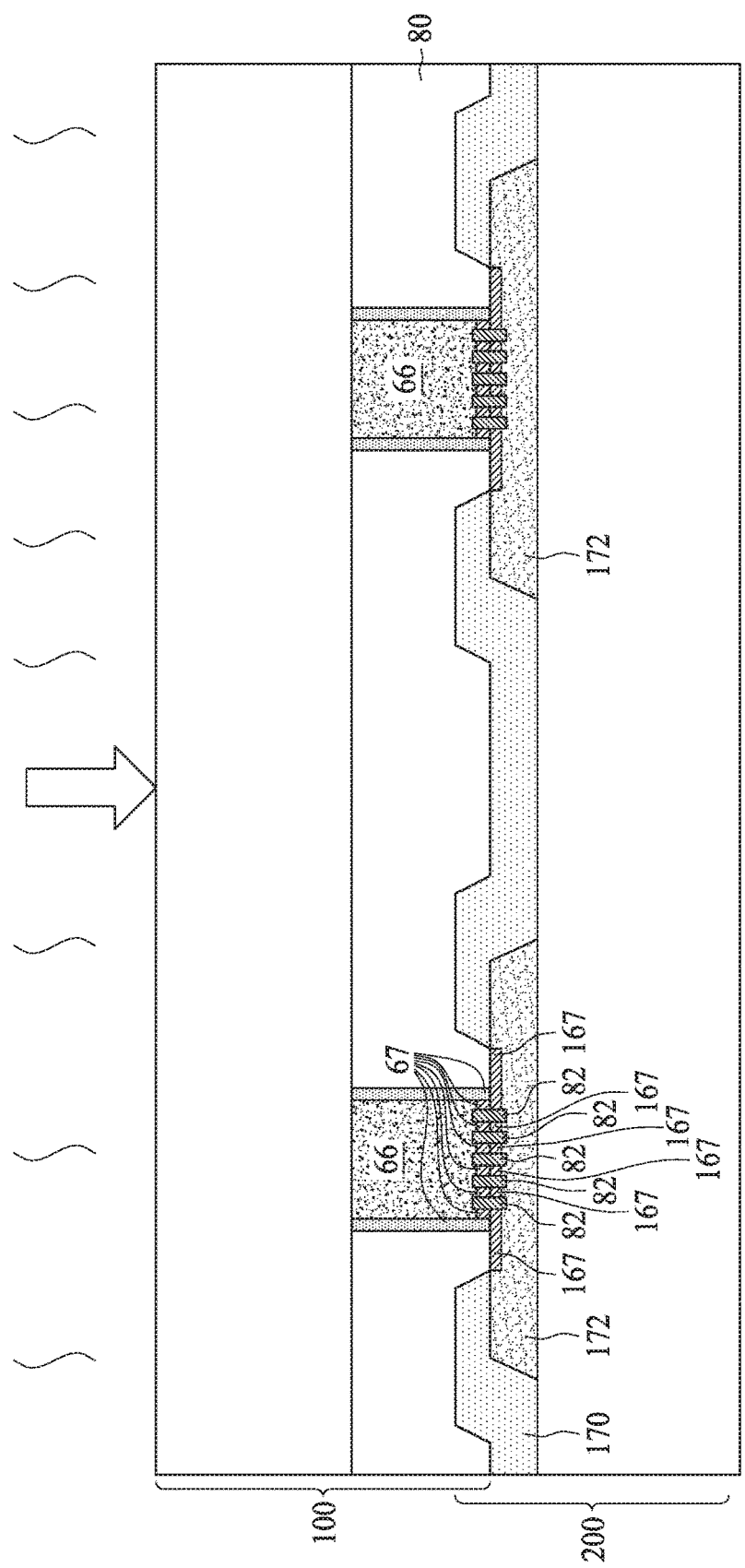

FIG. 9 illustrates an initial stage, wherein package components 100 and 200 are spaced apart from each other. Package components 100 and 200 may be discrete dies or unsawed wafers. Accordingly, the bonding process shown in FIGS. 9 through 13 may be a die-to-die bonding process, a wafer-to-wafer bonding process, or a die-to-wafer bonding process. Metal bumps 66 in package component 100 include oxide layers 67 at their surfaces. Oxide layers 67 may also be on the sidewalls of metal bumps 66, as schematically illustrated in FIG. 13. Oxide layers 67 may be native oxide layers. For example, when metal bumps 66 are copper bumps, oxide layers 67 are copper oxide layers. Metal pads 172 in package component 200 include oxide layers 167 at their surfaces. Oxide layers 167 may also be native oxide layers. For example, when metal pads 172 are aluminum pads, oxide layers 167 are aluminum oxide layers. Oxide layers 67 and 167 are continuous oxide layers fully covering the metal bumps 66 and metal pads 172.

Package component 100 is picked up, for example, using a vacuum head, so that metal bumps 66 are spaced apart from metal pads 172. Next, package component 100 is moved toward package component 200, so that metal bumps 66 strike metal pads 172. The respective process step is shown as step 304 in the process flow shown in FIG. 18. As a result of the striking, the continuous oxide layers 67 and 167 are broken into smaller pieces. Also, some originally covered un-oxidized surfaces of metal bumps 66 and metal pads 172 are exposed through the now non-continuous oxide layers 67 and 167.

The speed of package component 100 (at the time of impact) is great enough to break a significant percentage of oxide layers 67 and 167. For example, more than 10 percent, 20 percent, 30 percent, 40 percent, or 50 percent or more of the un-oxidized surfaces of the impacted metal bumps 66 and metal pads 172 are exposed, depending on how many strikes are to be formed. If fewer strikes are to be performed, in each of the strikes, a higher percentage of the un-oxidized surfaces of metal bumps 66 and metal pads 172 are to be exposed by each strike. To break oxide layers 67 and 167, the relative speed of package components 100 and 200 are selected to be great enough. For example, at the time of impact, the relative speed of metal bumps 66 and metal pads 172 may be higher than about 100 μm/second.

Figure 10:
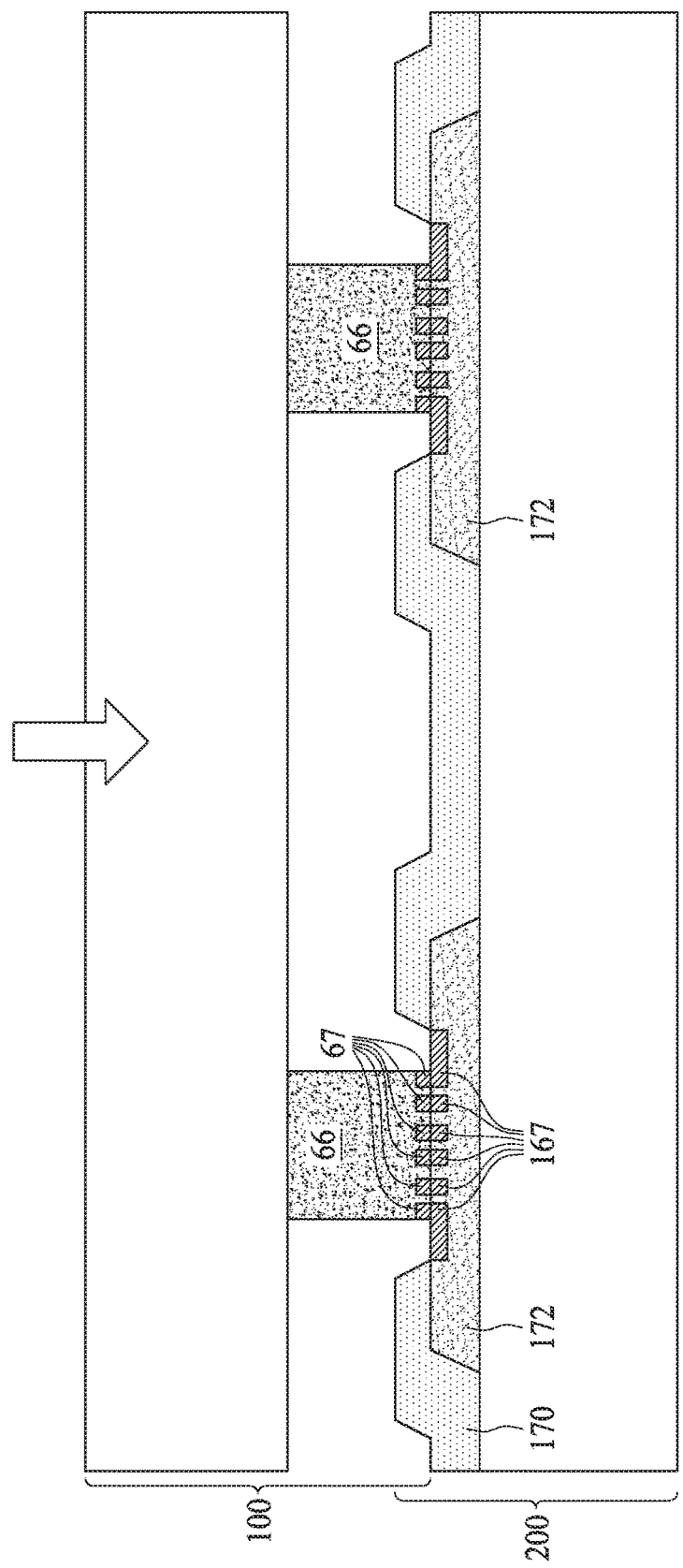

FIG. 10 illustrates a cross-sectional view of package components 100 and 200 during the impact, wherein oxide layers 67 and 167 are illustrated as broken into smaller pieces, and some of the surfaces of metal bumps 66 and 172 are exposed through the gaps between the smaller pieces. It is appreciated that the patterns of the broken pieces of oxide layers 67 and 167 are random, although FIGS. 10 through 12 illustrate the broken pieces as a more regular pattern.

Figure 11:
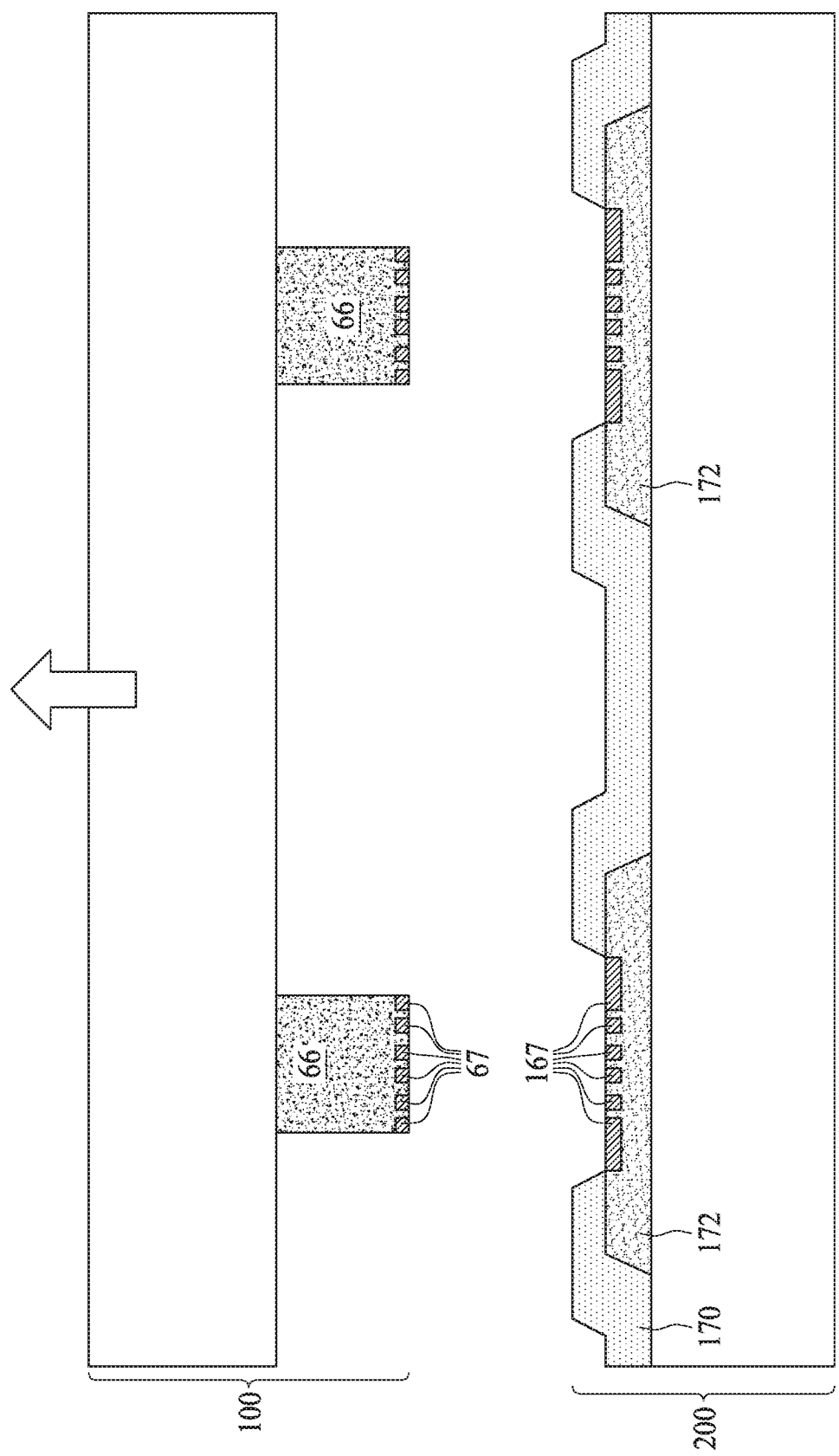

Referring to FIG. 11, package component 100 is picked up again until it is spaced apart from package component 200. A second strike process is performed, as shown in FIG. 12. The respective process step is shown as step 306 in the process flow shown in FIG. 18. The second striking results in the already broken pieces of oxide layers 67 and 167 to be further broken into smaller pieces. Furthermore, as a result of the second strike process, more un-oxidized surfaces of metal bumps 66 and metal pads 172 are exposed through the broken pieces of oxide layers 67 and 167. The second striking may result in the percentage of the exposed surface of metal bumps 66 to be increased (compared to the first strike) by more than about 10 percent. At the time of the impact of the second strike process, the relative speed of metal bumps 66 and metal pads 172 may be higher than about 100 μm/second.

After the second strike processes, some exposed surfaces of un-oxidized metal bumps 66 are in direct contact with the exposed surfaces of un-oxidized metal pads 172. In accordance with some embodiments, more strike processes are performed after the second strike process, each resulting in oxide layers 67 and 167 to be broken into smaller pieces, and possibly resulting in more un-oxidized surfaces to be exposed. The total number of strike processes is controlled to prevent other parts of package components 100 and 200 to be damaged. For example, the total number of strike processes is smaller than 10. In accordance with alternative embodiments, no more strike process is performed after the second strike, and package components 100 and 200 are annealed.

In accordance with alternative embodiments, the strike processes are performed with oxide layers 67 and the respective oxide layers 167 remaining to be contacted during the entire striking processes. For example, oxide layers 67 are first put into contact (without striking) with the respective oxide layers 167. Next, a tool (similar to a hammer, not shown) is used to strike package component 100 that is in contact with package component 200. During and between each of the strikes, package component 100 remains to be in contact with package component 200.

At the time the strike processes are finished, all un-oxidized surfaces of a metal bump 66 in direct contact with un-oxidized portions of the correspond metal pad 172 have a total area. The ratio of the total area to a total bottom area of metal bump 66 may be greater than about 30 percent, which is preferred to be high in order to improve the reliability of the bonding.

During and between the strike processes, package components 100 and 200 may not be heated, and may be at room temperature (for example, between about 17° C. and about 23° C.). After the final strike process, which may be the second or a later strike process, metal bumps 66 remain to be in contact with the corresponding metal pads 172 without being separated again. An annealing is then performed, during which metal bumps 66 are kept in contact with the corresponding metal pads 172 also. The respective process step is shown as step 308 in the process flow shown in FIG. 18. The annealing may be performed at a temperature in the range between about 150° C. and about 250° C. The annealing duration may be between about 1.5 hours and about 2.5 hours.

During the annealing, copper and aluminum that are in direct contact with each other inter-diffuse (with copper having a higher diffusion rate than aluminum) to each other. In the places where oxide pieces 67 and 167 exist, substantially no inter-diffusion occurs. As a result of the diffusion, Inter-Metallic Compound (IMC) 82 is formed, as schematically illustrated in FIG. 13, and hence metal bumps 66 are bonded to metal pads 172. IMC 82 includes the alloy of copper and aluminum, and possibly other elements (if any) in metal bumps 66 and metal pad 172. After the bonding of package components 100 and 200, underfill 80 may be dispense into the gap between package components 100 and 200. Underfill 80 may be in contact with the oxide layers 67 on the sidewalls of metal bumps 66, and in contact with oxide layers 167.

Figure 14:
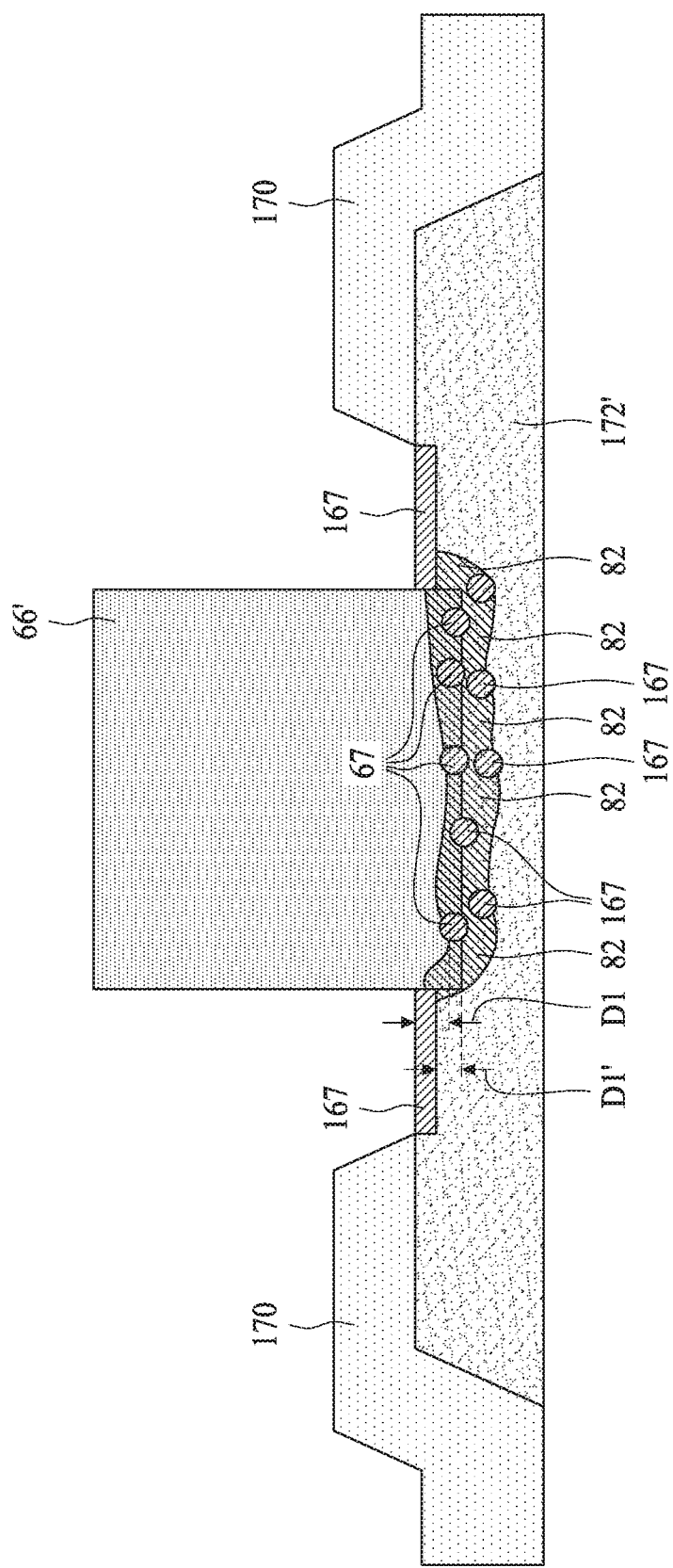

Since the bottom portions of metal bumps 66 are converted into IMCs 82, the remaining unconverted portions of metal bumps 66 are referred to as metal bumps 66'. Similarly, the unconverted remaining portions of metal pads 172 are referred to as metal pads 172' hereinafter. FIG. 14 illustrates an amplified view of a portion of metal bump 66' and metal pad 172'. As schematically illustrated in FIG. 14, at the interface of metal bump 66 and metal pad 172', there exist oxide portions 67, oxide portions 167, and IMC 82, which separate (un-oxidized and un-alloyed) metal bump 66' from (un-oxidized and un-alloyed) metal pad 172'. Some oxide portions 67 (or 167) may have upper surfaces contacting metal bump 66' and bottom surfaces contacting metal pad 172'. Some other oxide portions 67 (or 167) may be fully in (and enclosed by) IMC 82. Accordingly, some oxide portions 67 and 167 may form islands fully encircled (or enclosed) by IMC 82, and some portions of IMC 82 may be encircled by oxide portions 67 and/or 167. Furthermore, metal bump 66' may extend into metal pad 172' by depth D1 (i.e., the vertical distance between the bottom surface of oxide layer 167 (unchanged portion) and the lowest point of metal bump 66'), which is greater than about 0.1 μm in accordance with some embodiments. It is noted that the original metal bump 66 is struck into metal pad 172' by distance D1', which is the vertical distance between the bottom surface of oxide layer 167 and a middle height of IMC 82 (assuming the portions of metal bump 66 and metal pad 172 converted into IMC 82 have the same thickness).

In accordance with some exemplary embodiments, metal bumps 66 are copper bumps, and metal pads 172 are aluminum pads. In accordance with other embodiments, metal bumps 66 are aluminum bumps, and metal pads 172 are copper pads.

Figure 15:
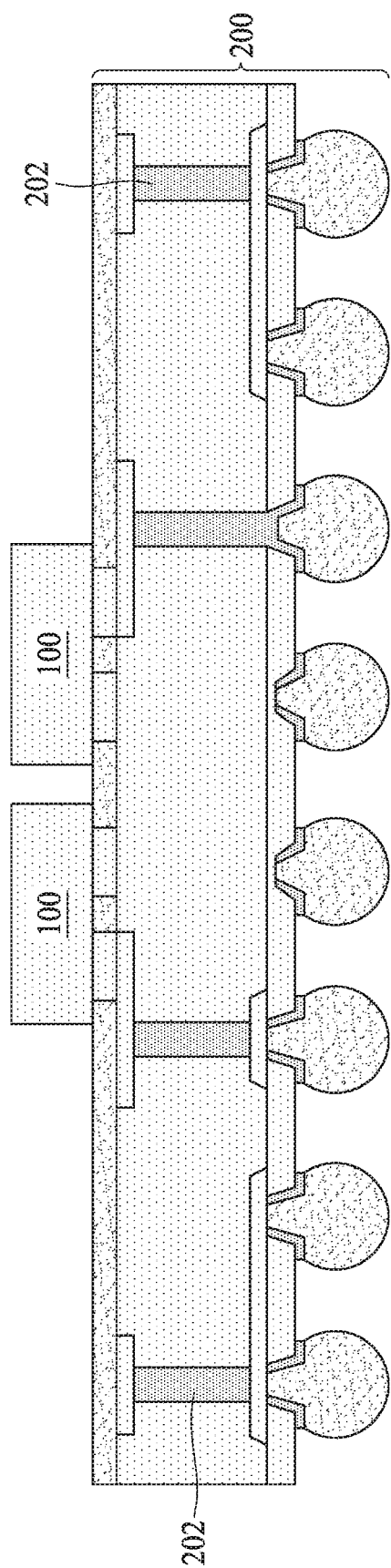
FIGS. 15 through 17 illustrate the cross-sectional views of some bonded packages in accordance with some embodiments.
Figure 16:
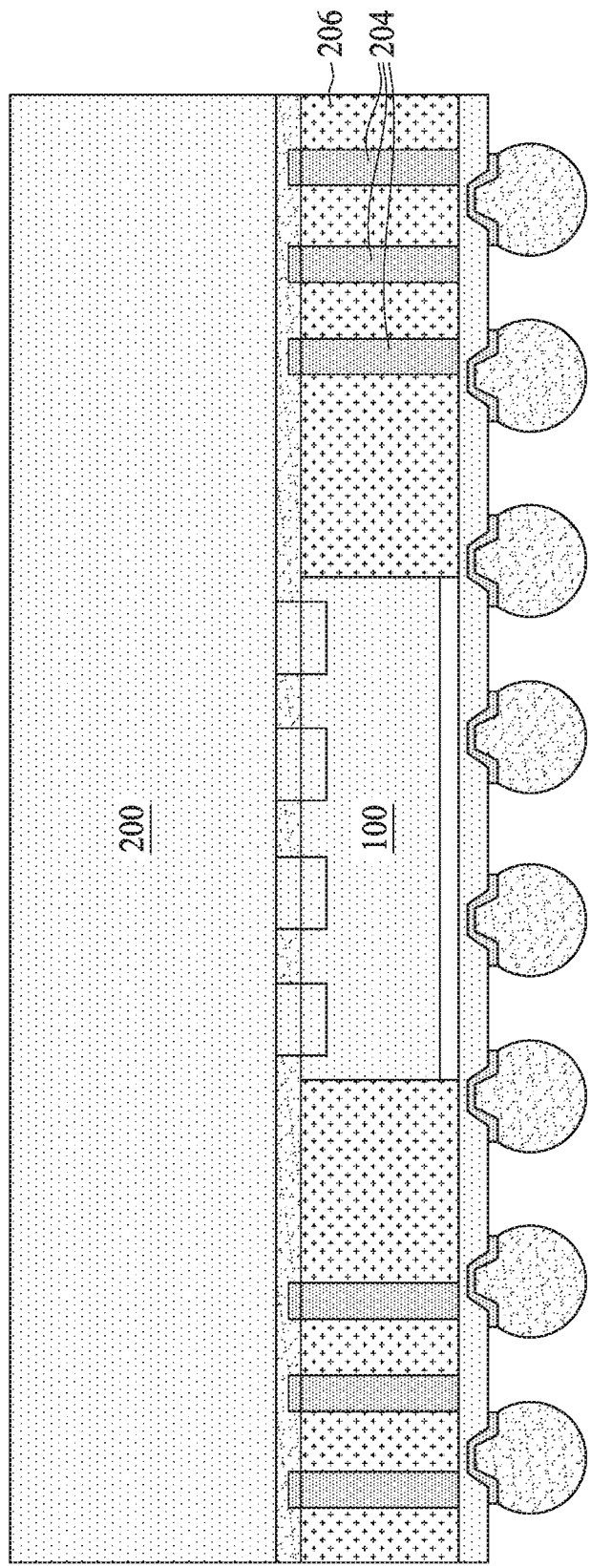
Figure 17:
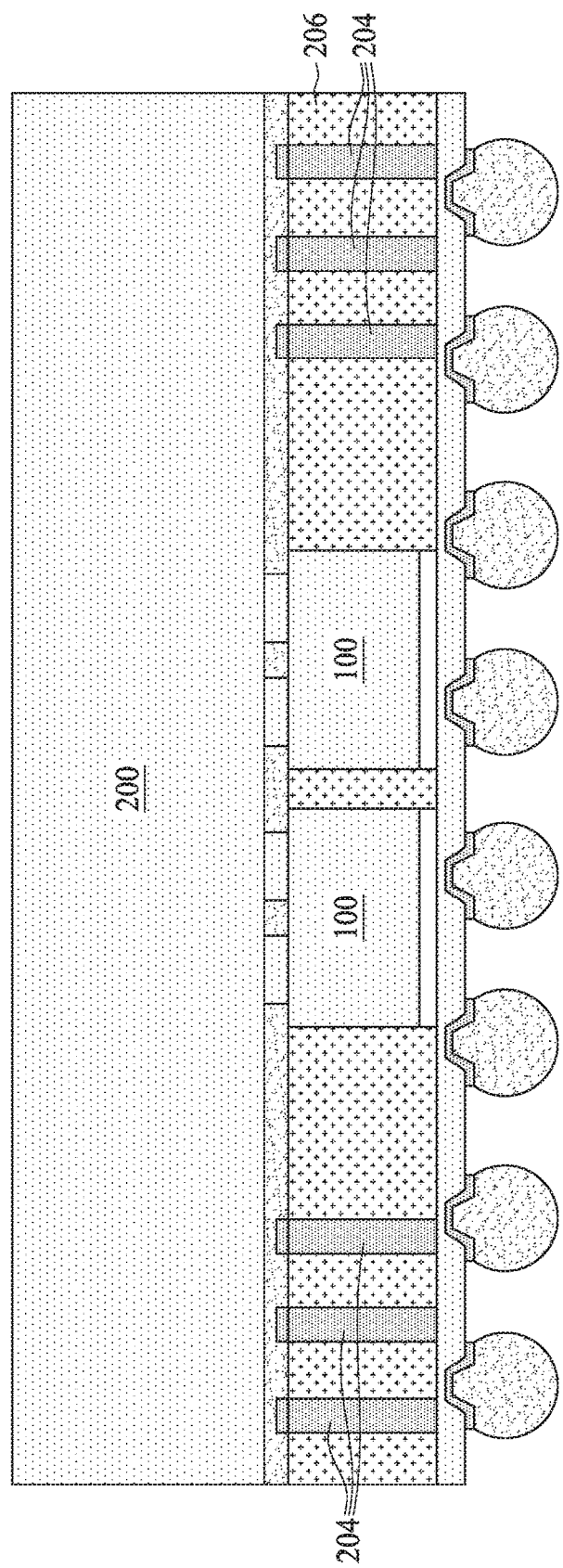

FIGS. 15 through 17 illustrate some applications in accordance with some embodiments. The bond structures and the bonding process of package components 100 and 200 in FIGS. 15 and 17 may be essentially the same as shown in FIGS. 1 through 14, and hence the process details and materials in these applications are not repeated herein. FIG. 15 illustrates a Chip-on-Wafer (CoW) structure, wherein chips 100 are bonded to wafer 200. Wafer 200 may be a device wafer including active devices therein, or an interposer wafer free from active devices. Through-vias 202 penetrate through the substrate (a semiconductor substrate, for example) of wafer 200.

FIG. 16 illustrates an Integrated Fan-Out (InFO) structure, which includes through-vias 204 penetrating through encapsulating material (such as molding compound) 206. Chip 100 is bonded to Chip (or wafer) 200, wherein encapsulating material also 206 encapsulates chip 100 therein. FIG. 17 illustrates a structure similar to the structure shown in FIG. 16, wherein there are two chips 100 bonded to the same chip 200.

The embodiments of the present disclosure have some advantageous features. By bonding aluminum with copper directly, solder regions, nickel layers, or the like, which are used in conventional bonding structures, are no longer needed. The multiple strike processes may be performed, and hence there is no need to use chemical solutions to remove oxide layers. The cost of the bonding process is thus saved, and the throughput of the bonding process is enhanced. The copper bump may be formed directly as a top metal layer in the respective wafer/die, and hence the structure and the formation process of the respective wafer is simplified, and cost is reduced.

In accordance with some embodiments of the present disclosure, a method includes performing a first strike process to strike a metal bump of a first package component against a metal pad of a second package component. A first one of the metal bump and the metal pad includes copper. A second one of the metal bump and the metal pad includes aluminum. The method further includes performing a second strike process to strike the metal bump against the metal pad. An annealing is performed to bond the metal bump on the metal pad.

In accordance with some embodiments of the present disclosure, a method includes raising a first package component over and spaced apart from a second package component, and performing a first strike process to strike the first package component against the second package component. The method further includes, after the first strike process, raising the first package component over and spaced apart from the second package component, performing a second strike process to strike the first package component against the second package component, and annealing the first package component and the second package component to bond the first package component to the second package component.

In accordance with some embodiments of the present disclosure, a structure includes a first package component having a copper-containing bump, and a second package component having an aluminum-containing pad. The copper-containing bump is bonded to the aluminum-containing pad. The copper-containing bump extends into the aluminum-containing pad. An IMC joins the copper-containing bump to the aluminum-containing pad, and the IMC includes copper and aluminum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first package component comprising a copper-containing bump;
    a second package component comprising an aluminum-containing pad, wherein the copper-containing bump is bonded to the aluminum-containing pad, and wherein the copper-containing bump extends into the aluminum-containing pad; and
    an Inter-Metallic Compound (IMC) joining the copper-containing bump to the aluminum-containing pad, wherein the IMC comprises copper and aluminum.

2. The package of claim 1 further comprising:
    a plurality of discrete aluminum oxide pieces contacting the IMC; and
    a plurality of discrete copper oxide pieces contacting the IMC.

3. The package of claim 2, wherein one of the plurality of discrete aluminum oxide pieces and the plurality of discrete copper oxide pieces is encircled by the IMC.

4. The package of claim 2, wherein one of the plurality of discrete aluminum oxide pieces and the plurality of discrete copper oxide pieces has a top surface in contact with an un-oxidized portion of the copper-containing bump, and a lower portion embedded in the IMC.

5. The package of claim 2, wherein one of the plurality of discrete aluminum oxide pieces and the plurality of discrete copper oxide pieces is fully enclosed in the IMC.

6. The package of claim 1, wherein the second package component further comprises a passivation layer covering edge portions of the aluminum-containing pad, and the copper-containing bump extends into an opening in the passivation layer.

7. The package of claim 6 further comprising an aluminum oxide layer covering and contacting an un-oxidized portion of the aluminum-containing pad, wherein the aluminum oxide layer comprises a first edge contacting the copper-containing bump, and a second edge co-terminus with an edge of the passivation layer.

8. The package of claim 1 further comprising an underfill between the first package component and the second package component, wherein the underfill encircles the copper-containing bump.

9. The package of claim 1, wherein the copper-containing bump extends into the aluminum-containing pad by a depth greater than about 0.1 µm.

10. A package comprising:
    a first package component comprising a copper-containing bump protruding out of a major surface of the first package component;

a second package component comprising an aluminum-containing pad, wherein the copper-containing bump is bonded to the aluminum-containing pad;
a plurality of discrete aluminum oxide pieces distributed throughout an interface between the copper-containing bump; and
a plurality of discrete copper oxide pieces distributed throughout the interface.

11. The package of claim 10 further comprising:
an Inter-Metallic Compound (IMC) of copper and aluminum at the interface, wherein the plurality of discrete aluminum oxide pieces and the plurality of discrete copper oxide pieces are separated from each other by the IMC.

12. The package of claim 10, wherein the copper-containing bump extends into the aluminum-containing pad.

13. The package of claim 12 further comprising an aluminum oxide layer at a surface of the aluminum-containing pad, wherein the copper-containing bump penetrates through the aluminum oxide layer.

14. The package of claim 10, wherein the plurality of discrete aluminum oxide pieces and the plurality of discrete copper oxide pieces have random sizes.

15. A package comprising:
a first package component comprising a copper-containing bump protruding out of a major surface of the first package component; and
a second package component comprising:
an aluminum-containing pad;
a passivation layer covering edge portions of the aluminum-containing pad; and
an aluminum oxide layer over and contacting the aluminum-containing pad, wherein edges of the aluminum oxide layer are substantially aligned to edges of the passivation layer, and the copper-containing bump penetrates through the aluminum oxide layer to bond to the aluminum-containing pad.

16. The package of claim 15 further comprising a plurality of discrete aluminum oxide pieces at an interface between the copper-containing bump and the aluminum-containing pad, wherein the plurality of discrete aluminum oxide pieces is separated from each other by an Inter-Metallic Compound (IMC) of copper and aluminum.

17. The package of claim 16, wherein the first package component is over the second package component and the plurality of discrete aluminum oxide pieces is below an interface between the aluminum oxide layer and the aluminum-containing pad.

18. The package of claim 15 further comprising a plurality of discrete copper oxide pieces at an interface between the copper-containing bump and the aluminum-containing pad, wherein the plurality of discrete copper oxide pieces is separated from each other by an Inter-Metallic Compound (IMC) of copper and aluminum.

19. The package of claim 15, wherein the second package component comprises a wafer, and the first package component is a device die.

20. The package of claim 15, wherein both the first package component and the second package component are device wafers.

* * * * *